United States Patent
Wang et al.

(10) Patent No.: US 11,114,507 B2
(45) Date of Patent: *Sep. 7, 2021

(54) PIXEL ARRANGEMENT, MANUFACTURING METHOD THEREOF, DISPLAY PANEL, DISPLAY DEVICE AND MASK

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Benlian Wang, Beijing (CN); Yangpeng Wang, Beijing (CN); Yang Wang, Beijing (CN); Haijun Yin, Beijing (CN); Haijun Qiu, Beijing (CN); Yao Hu, Beijing (CN); Weinan Dai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 143 days.

This patent is subject to a terminal disclaimer.

(21) Appl. No.: 16/470,161

(22) PCT Filed: Dec. 19, 2018

(86) PCT No.: PCT/CN2018/122063
§ 371 (c)(1),
(2) Date: Jun. 14, 2019

(87) PCT Pub. No.: WO2019/134518
PCT Pub. Date: Jul. 11, 2019

(65) Prior Publication Data
US 2020/0357861 A1 Nov. 12, 2020

(30) Foreign Application Priority Data
Jan. 2, 2018 (CN) .......................... 201810002785.4

(51) Int. Cl.
H01L 27/32 (2006.01)
H01L 51/56 (2006.01)
(Continued)

(52) U.S. Cl.
CPC .......... *H01L 27/3216* (2013.01); *C23C 14/04* (2013.01); *C23C 14/042* (2013.01);
(Continued)

(58) Field of Classification Search
CPC . H01L 27/3216; H01L 27/3218; H01L 51/56; C23C 14/04; C23C 14/24; C23C 14/042
See application file for complete search history.

(56) References Cited

U.S. PATENT DOCUMENTS

2013/0234917 A1 9/2013 Lee
2015/0109268 A1 4/2015 Huang et al.
(Continued)

FOREIGN PATENT DOCUMENTS

CN 103311266 A 9/2013
CN 103941490 A 7/2014
(Continued)

OTHER PUBLICATIONS

International Search Report and Written Opinion of the International Searching Authority (with English language translation), International Application No. PCT/CN2018/122063, dated Mar. 18, 2019, 13 pp.
(Continued)

Primary Examiner — Joseph C. Nicely
(74) Attorney, Agent, or Firm — Myers Bigel, P.A.

(57) ABSTRACT

A pixel arrangement including first groups of sub-pixels arranged in a first direction, each of the first groups includ-
(Continued)

ing first sub-pixels and third sub-pixels arranged alternately, and second groups of sub-pixels arranged in the first direction, each of the second groups including third sub-pixels and second sub-pixels arranged alternately. The first groups and the second groups are alternately arranged in a second direction perpendicular to the first direction. The first groups and the second groups are arranged to form third groups of sub-pixels arranged in the second direction and fourth groups of sub-pixels arranged in the second direction. The third groups and the fourth groups are alternately arranged in the first direction. Each of the third groups includes first sub-pixels and third sub-pixels arranged alternately. Each of the fourth groups includes third sub-pixels and second sub-pixels arranged alternately.

20 Claims, 12 Drawing Sheets

(51) Int. Cl.
 *C23C 14/04* (2006.01)
 *C23C 14/24* (2006.01)
(52) U.S. Cl.
 CPC ............ *C23C 14/24* (2013.01); *H01L 27/326* (2013.01); *H01L 27/3218* (2013.01); *H01L 51/56* (2013.01)

(56) References Cited

U.S. PATENT DOCUMENTS

| | | | |
|---|---|---|---|
| 2015/0162391 A1 | 6/2015 | Kim | |
| 2016/0253943 A1* | 9/2016 | Wang | H01L 27/3218 345/694 |
| 2017/0287988 A1 | 10/2017 | Lee et al. | |
| 2017/0294491 A1 | 10/2017 | Jo et al. | |
| 2017/0309688 A1 | 10/2017 | Lee et al. | |
| 2018/0357953 A1 | 12/2018 | Hu | |
| 2018/0366052 A1 | 12/2018 | Shi | |
| 2019/0035861 A1 | 1/2019 | Wang et al. | |
| 2020/0343318 A1* | 10/2020 | Li | H01L 21/77 |
| 2020/0357322 A1* | 11/2020 | Wu | G09G 3/3208 |
| 2020/0357862 A1* | 11/2020 | Wang | H01L 27/3218 |

FOREIGN PATENT DOCUMENTS

| | | |
|---|---|---|
| CN | 104282727 A | 1/2015 |
| CN | 104701341 A | 6/2015 |
| CN | 105826349 A | 8/2016 |
| CN | 106298851 A | 1/2017 |
| CN | 106486513 A | 3/2017 |
| CN | 106920832 A | 7/2017 |
| CN | 107248378 A | 10/2017 |
| CN | 107275359 A | 10/2017 |
| CN | 107275360 A | 10/2017 |
| CN | 107305905 A | 10/2017 |
| CN | 207966985 U | 10/2018 |
| CN | 207966994 U | 10/2018 |
| CN | 207966995 U | 10/2018 |
| KR | 1020170116598 A | 10/2017 |

OTHER PUBLICATIONS

First Review Notice and English language translation, CN Application No. 201820003815.9, Jun. 19, 2018, 4 pp.
International Search Report and Written Opinion of the International Searching Authority (with English language translation), International Application No. PCT/CN2018/122021, dated Feb. 27, 2019, 11 pp.
International Search Report and Written Opinion of the International Searching Authority (with English language translation), International Application No. PCT/CN2018/122205, dated Feb. 27, 2019, 14 pp.
International Search Report and Written Opinion of the International Searching Authority (with English language translation), International Application No. PCT/CN2018/122206, dated Mar. 25, 2019, 11 pp.
International Search Report and Written Opinion of the International Searching Authority (with English language translation), International Application No. PCT/CN2018/122022, dated Mar. 26, 2019, 11 pp.

* cited by examiner

1100C

PIXEL ARRANGEMENT, MANUFACTURING METHOD THEREOF, DISPLAY PANEL, DISPLAY DEVICE AND MASK

CROSS-REFERENCE TO RELATED APPLICATIONS

The present application is a 35 U.S.C. 371 national stage application of PCT International Application No. PCT/CN2018/122063, filed on Dec. 19, 2018, which claims priority to Chinese Patent Application No. 201810002785.4 filed on Jan. 2, 2018, the entire disclosures of which are incorporated herein by reference.

TECHNICAL FIELD

The present disclosure relates to the field of display technologies, and in particular, to a pixel arrangement, a method of manufacturing the pixel arrangement, a display panel, a display device, and a mask.

BACKGROUND

Compared with liquid crystal displays (LCDs), organic electroluminescent (OLED) displays have advantages such as low energy consumption, low production cost, self-illumination, wide view angle and fast responsiveness. OLED display devices have recently begun to replace traditional liquid crystal displays in the field of flat panel display such as mobile phones, PDAs, and digital cameras.

An OLED display typically includes a base substrate and sub-pixels arranged in a matrix on the base substrate. The sub-pixels are generally formed by evaporating organic light-emitting materials on an array substrate using a fine metal mask (FMM).

SUMMARY

According to some embodiments of the present disclosure, a pixel arrangement is provided, comprising: a plurality of first groups of sub-pixels arranged in a first direction, each of the plurality of first groups comprising a plurality of first sub-pixels and a plurality of third sub-pixels arranged alternately; and a plurality of second groups of sub-pixels arranged in the first direction, each of the plurality of second groups comprising a plurality of third sub-pixels and a plurality of second sub-pixels arranged alternately. The plurality of first groups and the plurality of second groups are alternately arranged in a second direction perpendicular to the first direction. The plurality of first groups and the plurality of second groups are arranged to form a plurality of third groups of sub-pixels arranged in the second direction and a plurality of fourth groups of sub-pixels arranged in the second direction, the plurality of third groups and the plurality of fourth groups are alternately arranged in the first direction, each of the plurality of third groups comprises a plurality of first sub-pixels and a plurality of third sub-pixels arranged alternately, and each of the plurality of fourth groups comprises a plurality of third sub-pixels and a plurality of second sub-pixels arranged alternately.

In some embodiments, at least a portion of the plurality of third sub-pixels in each of the first groups each have a first shape, and at least a portion of the plurality of third sub-pixels in each of the second groups each have a second shape different from the first shape.

In some embodiments, the third sub-pixels have substantially a same area.

In some embodiments, first ones of the third sub-pixels each have an area and second ones of the third sub-pixels each have another area different from the area.

In some embodiments, the third sub-pixels are arranged such that each of first ones of the third sub-pixels has a first distance from a corresponding one, directly adjacent thereto, of the first sub-pixels in one of the first direction and the second direction, and each of second ones of the third sub-pixels has a second distance from a corresponding one, directly adjacent thereto, of the first sub-pixels in another one of the first direction and the second direction. The third sub-pixels are arranged such that each of first ones of the third sub-pixels has a third distance from a corresponding one, directly adjacent thereto, of the second sub-pixels in one of the first direction and the second direction, and each of second ones of the third sub-pixels has a fourth distance from a corresponding one, directly adjacent thereto, of the second sub-pixels in another one of the first direction and the second direction.

In some embodiments, the first sub-pixels, the second sub-pixels, and the third sub-pixels are arranged substantially equidistantly with respect to each other.

In some embodiments, the third sub-pixels are arranged substantially equidistantly with respect to each other, and the first sub-pixels and the second sub-pixels are arranged substantially equidistantly with respect to each other.

In some embodiments, each of the third sub-pixels in the plurality of first groups of sub-pixels has a side substantially parallel and opposite to a side of a directly adjacent one of the first sub-pixels in the first direction. Each of the third sub-pixels in the plurality of second groups of sub-pixels has a side substantially parallel and opposite to a side of a directly adjacent one of the second sub-pixels in the first direction. Each of the third sub-pixels in the plurality of third groups of sub-pixels has a side substantially parallel and opposite to a side of a directly adjacent one of the first sub-pixels in the second direction. Each of the third sub-pixels in the plurality of fourth groups of sub-pixels has a side substantially parallel and opposite to a side of a directly adjacent one of the second sub-pixels in the second direction.

In some embodiments, the third sub-pixels in the plurality of first groups each have the first shape, and the third sub-pixels in the plurality of second groups each have the second shape.

In some embodiments, first ones of the third sub-pixels in each of the plurality of first groups each have the first shape, and second ones of the third sub-pixels in each of the plurality of first groups each have the second shape, the first shape and the second shape alternately appearing for the third sub-pixels in the first groups. First ones of the third sub-pixels in each of the plurality of second groups each have the second shape, and second ones of the third sub-pixels in each of the plurality of first groups each have the first shape, the first shape and the second shape alternately appearing for the third sub-pixels in the second groups.

In some embodiments, the third groups of sub-pixels have substantially a same pattern as the first groups of sub-pixels, and the fourth groups of sub-pixels have substantially a same pattern as the second groups of sub-pixels.

In some embodiments, the first sub-pixels have substantially a same area.

In some embodiments, first ones of the first sub-pixels each have an area and second ones of the first sub-pixels each have another area different from the area.

In some embodiments, the first sub-pixels have substantially a same shape.

In some embodiments, first ones of the first sub-pixels each have a shape and second ones of the first sub-pixels each have another shape different from the shape.

In some embodiments, the second sub-pixels have substantially a same area.

In some embodiments, first ones of the second sub-pixels each have an area and second ones of the second sub-pixels each have another area different from the area.

In some embodiments, the second sub-pixels have substantially a same shape.

In some embodiments, first ones of the second sub-pixels each have a shape and second ones of the second sub-pixels each have another shape different from the shape.

In some embodiments, the first sub-pixels are red sub-pixels, the second sub-pixels are blue sub-pixels, and the third sub-pixels are green sub-pixels.

In some embodiments, the first sub-pixels are blue sub-pixels, the second sub-pixels are red sub-pixels, and the third sub-pixels are green sub-pixels.

In some embodiments, the blue sub-pixels each have a first area, the red sub-pixels each have a second area smaller than the first area, and the green sub-pixels each have a third area smaller than the second area.

In some embodiments, the blue sub-pixels each have a first area, the green sub-pixels each have a second area smaller than the first area, and the red sub-pixels each have a third area smaller than the second area.

In some embodiments, the red sub-pixels have a first total area, the green sub-pixels have a second total area, and the blue sub-pixels have a third total area. The first total area, the second total area, and the third total area have a ratio of 1:(1.1 to 1.5):(1.2 to 1.7), further 1:(1.2 to 1.35):(1.4 to 1.55), or further 1:1.27:1.46.

In some embodiments, the red sub-pixels, the green sub-pixels, and the blue sub-pixels have a ratio of approximately 1:2:1 in quantity.

In some embodiments, the first shape and the second shape are selected from a group consisting of a rectangle, an ellipse, a convex polygon, a concave polygon, a triangle, and a circle.

According to some embodiments of the present disclosure, a display panel is provided, comprising: a display substrate; and the pixel arrangement as described above. The pixel arrangement is formed on the display substrate. The pixel arrangement is arranged such that each of the first direction and the second direction intersects a length direction of the display substrate at approximately 45 degrees.

In some embodiments, the first sub-pixels, the second sub-pixels, and the third sub-pixels are organic electroluminescent sub-pixels.

According to some embodiments of the present disclosure, a display device is provided comprising the display panel as described above.

According to some embodiments of the present disclosure, a set of masks for manufacturing the pixel arrangement as described above is provided, comprising: a first mask defining a plurality of first openings arranged to have a pattern corresponding to a pattern of the first sub-pixels; a second mask defining a plurality of second openings arranged to have a pattern corresponding to a pattern of the second sub-pixels; and a third mask defining a plurality of third openings arranged to have a pattern corresponding to a pattern of the third sub-pixels.

According to some embodiments of the present disclosure, a method of manufacturing a pixel arrangement using the set of masks as described above is provided, comprising: providing a display substrate; evaporating a first electroluminescent material and depositing the evaporated first electroluminescent material onto the display substrate to form the first sub-pixels by passing the evaporated first electroluminescent material through the plurality of first openings of the first mask; evaporating a second electroluminescent material and depositing the evaporated second electroluminescent material onto the display substrate to form the second sub-pixels by passing the evaporated second electroluminescent material through the plurality of second openings of the second mask; and evaporating a third electroluminescent material and depositing the evaporated third electroluminescent material onto the display substrate to form the third sub-pixels by passing the evaporated third electroluminescent material through the plurality of third openings of the third mask.

According to some embodiments of the present disclosure, a pixel arrangement is provided, comprising: five first sub-pixels respectively at a center and four vertices of a first imaginary rectangle; four second sub-pixels at respective centers of four sides of the first imaginary rectangle; and four third sub-pixels within respective ones of four second imaginary rectangles, each of the second imaginary rectangles defined by a respective vertex of the four vertices of the first imaginary rectangle, respective centers of two adjoining ones, which contain the respective vertex, of the four sides of the first imaginary rectangle, and the center of the first imaginary rectangle, the four second imaginary rectangles forming the first imaginary rectangle.

According to some embodiments of the present disclosure, a display panel is provided, comprising: a display substrate; and a plurality of the pixel arrangements as described above that adjoin each other, wherein the pixel arrangements are formed on the display substrate. Each two directly adjacent ones of the first imaginary rectangles in a row direction have a common side, such that the sub-pixels on the common side are shared by the two directly adjacent ones of the first imaginary rectangles. Each two directly adjacent ones of the first imaginary rectangles in a column direction have a common side, such that the sub-pixels on the common side are shared by the two directly adjacent ones of the first imaginary rectangles.

According to some embodiments of the present disclosure, a pixel arrangement is provided, comprising: a plurality of first repeating units arranged in a first direction, each of the plurality of first repeating units comprising a plurality of first sub-pixels and a plurality of third sub-pixels arranged alternately; and a plurality of second repeating units arranged in the first direction, each of the plurality of second repeating units comprising a plurality of third sub-pixels and a plurality of second sub-pixels arranged alternately. The plurality of first repeating units and the plurality of second repeating units are alternately arranged in a second direction perpendicular to the first direction. The plurality of first repeating units and the plurality of second repeating units are arranged such that each of the first sub-pixels is directly adjacent to four corresponding ones of the third sub-pixels and each of the second sub-pixels is directly adjacent to four corresponding ones of the third sub-pixels.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

In the figures, different reference signs, combined by the same numeral and different letter suffixes, can be collectively referenced by the numeral.

DETAILED DESCRIPTION

Figure 1:
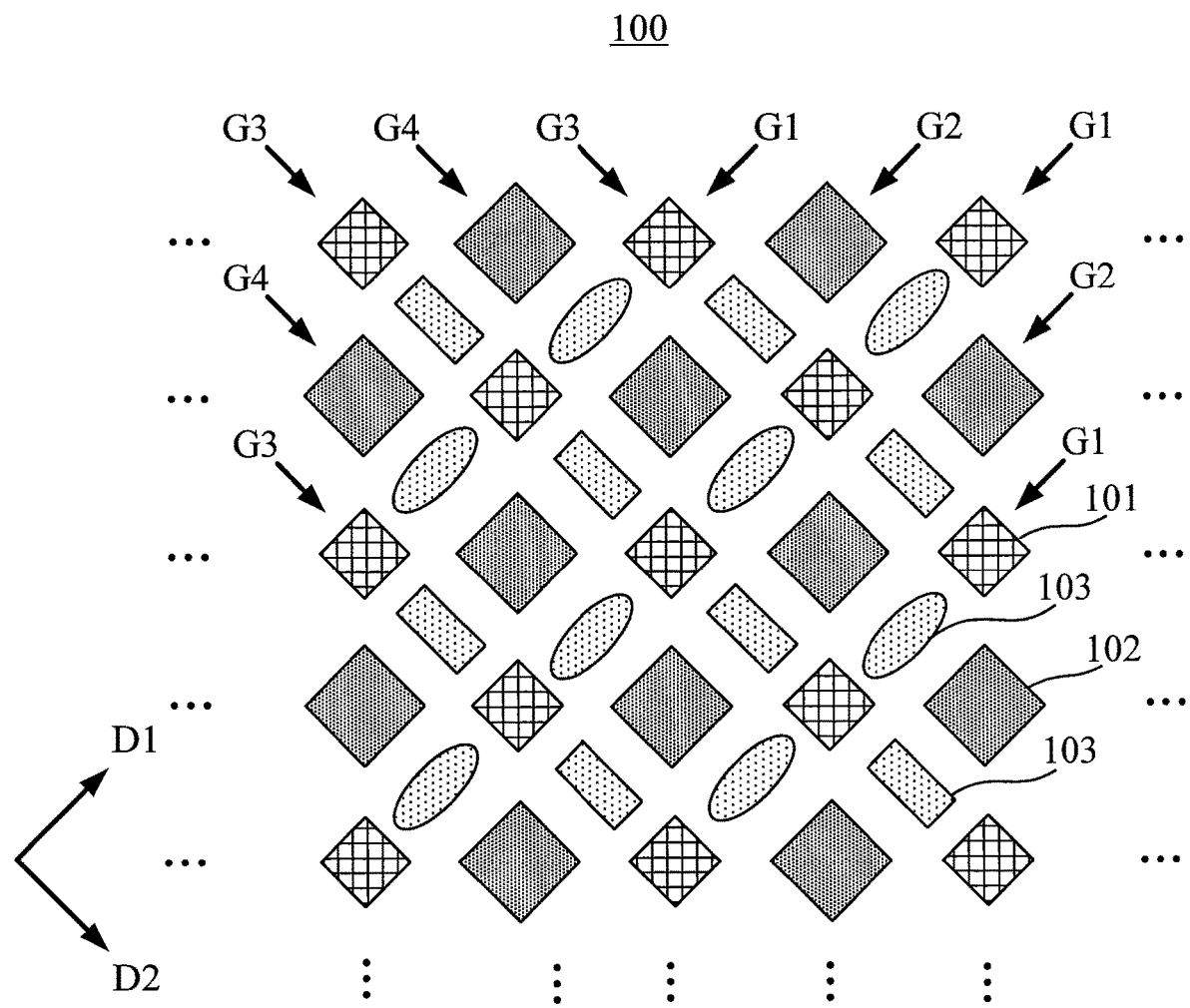
FIG. 1 is a schematic plan view of a pixel arrangement in accordance with an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGS is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "directly adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the FIGs. are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1 is a schematic plan view of a pixel arrangement 100 in accordance with an embodiment of the present disclosure.

As shown in FIG. 1, the pixel arrangement 100 includes a plurality of first groups of sub-pixels (also referred to as "first repeating units") G1 arranged in a first direction D1 and a plurality of second groups of sub-pixels (also referred to as "second repeating units") G2 arranged in the first direction D1. The plurality of first groups G1 and the plurality of second groups G2 are alternately arranged in a second direction D2 perpendicular to the first direction D1.

Each of the plurality of first groups G1 includes a plurality of first sub-pixels 101 and a plurality of third sub-pixels 103 that are alternately arranged. At least a portion of the plurality of third sub-pixels 103 in the first groups G1 have a first shape. In this embodiment, the third sub-pixels 103 in the plurality of first groups G1 each have the first shape (ellipse in the example of FIG. 1).

Each of the plurality of second groups G2 includes a plurality of third sub-pixels 103 and a plurality of second sub-pixels 102 that are alternately arranged. At least a portion of the plurality of third sub-pixels 103 in the second group G2 have a second shape different from the first shape. In this embodiment, the third sub-pixels 103 in the plurality of second groups G2 each have the second shape (rectangle in the example of FIG. 1).

The plurality of first groups G1 and the plurality of second groups G2 are further arranged to form a plurality of third groups of sub-pixels G3 arranged in the second direction D2 and a plurality of fourth groups of sub-pixels G4 arranged in the second direction D2. The plurality of third groups G3 and the plurality of fourth groups G4 are alternately arranged in the first direction D1. Each of the plurality of third groups G3 includes a plurality of first sub-pixels 101 and a plurality of third sub-pixels 103 arranged alternately, and each of the plurality of fourth groups G4 includes a plurality of third sub-pixels 103 and a plurality of second sub-pixels 102 arranged alternately. As shown in FIG. 1, each first sub-pixel 101 is directly adjacent to four third sub-pixels 103, and each second sub-pixel 102 is also directly adjacent to four third sub-pixels 103.

The pixel arrangement 100 can allow the first sub-pixels 101, the second sub-pixels 102, and the third sub-pixels 103 to be more closely arranged under the same process condition compared with an existing pixel arrangement, thereby increasing as much as possible the area of each single sub-pixel. This in turn facilitates the reduction of the drive current of the display device and an increase in the lifetime of the display device.

In the example of FIG. 1, the first, second, and third sub-pixels 101, 102, and 103 are arranged substantially equidistantly with respect to each other. In some variations, the third sub-pixels 103 may be arranged differently. For example, the third sub-pixels 103 may be arranged substantially equidistantly with respect to each other, and the first sub-pixels 101 and the second sub-pixels 102 are arranged substantially equidistantly with respect to each other. It will be understood that in this document the term "substantially" used in connection with "equidistantly", "parallel", "same", "equal to", etc., is intended to encompass variations due to the manufacturing process.

Figure 2:
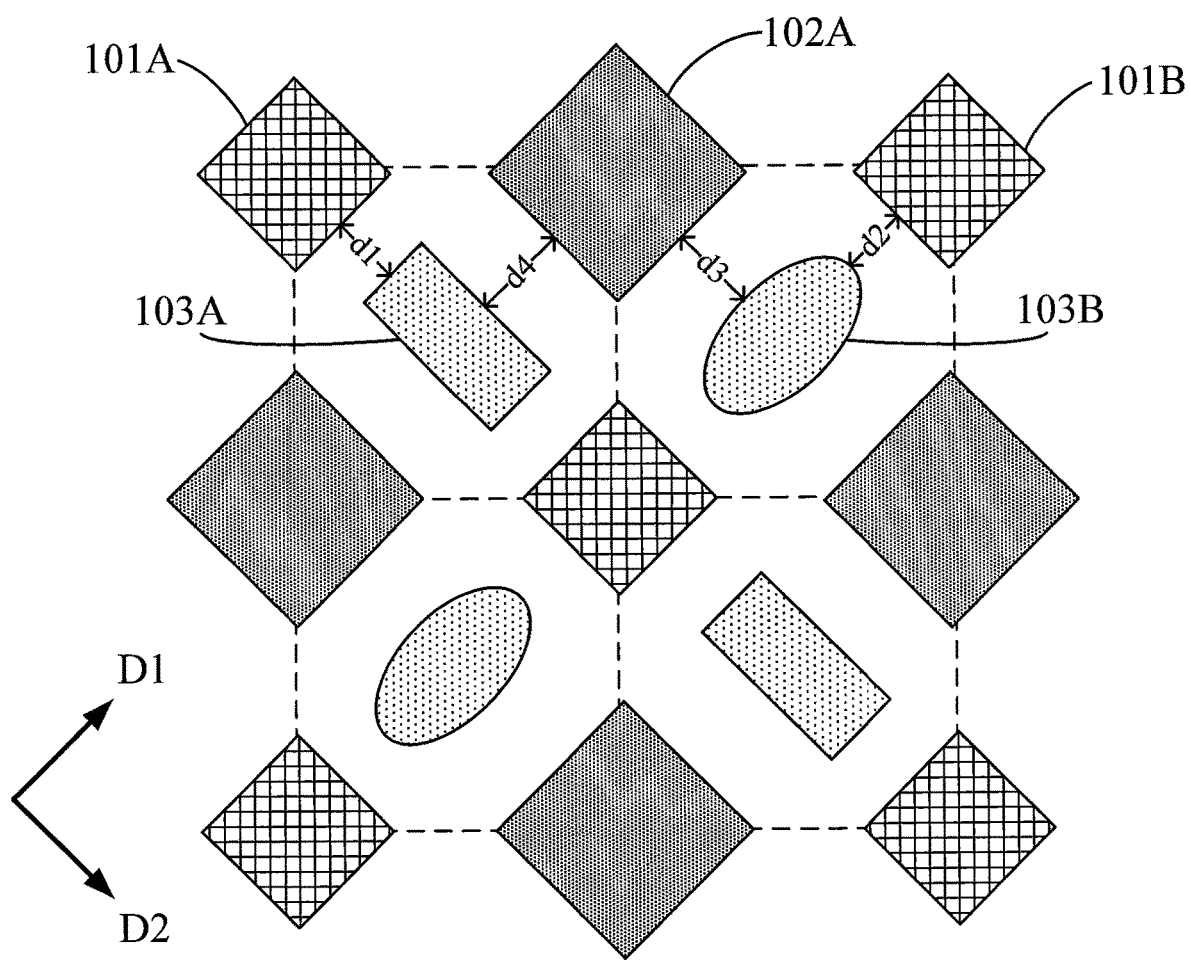
FIG. 2 is a schematic plan view of a partial area of the pixel arrangement of FIG. 1.

FIG. 2 is a schematic plan view of a partial area of the pixel arrangement 100 of FIG. 1.

In this embodiment, the third sub-pixels 103 are arranged such that each of first ones of the third sub-pixels 103 has a first distance from a corresponding one, directly adjacent thereto, of the first sub-pixels 101 in one of the first direction D1 and the second direction D2, and each of second ones of the third sub-pixels 103 has a second distance from a corresponding one, directly adjacent thereto, of the first sub-pixels 101 in the other one of the first direction D1 and the second direction D2. In the example of FIG. 2, the third sub-pixel 103A has a first distance d1 from the directly adjacent first sub-pixel 101A in the second direction D2, and the third sub-pixel 103B has a second distance d2 from the directly adjacent first sub-pixel 101B in the first direction D1. The ratio of the first distance d1 to the second distance d2 is in the range of 1 to 1.5, such as 1.1, 1.2, 1.3, 1.4, and the like. Such a configuration trades off between the area of the sub-pixels and the limit distance that the process can achieve, enabling flexible design of the pixel pattern.

In this embodiment, the third sub-pixels 103 are arranged such that each of first ones of the third sub-pixels 103 has a third distance from a corresponding one, directly adjacent thereto, of the second sub-pixels 102 in one of the first direction D1 and the second direction D2, and each of second ones of the third sub-pixels 103 has a fourth distance from a corresponding one, directly adjacent thereto, of the second sub-pixels 102 in the other one of the first direction D1 and the second direction D2. In the example of FIG. 2, the third sub-pixel 103B has a third distance d3 from the directly adjacent second sub-pixel 102A in the second direction D2, and the third sub-pixel 103A has a fourth distance d4 from the directly adjacent second sub-pixel 102A in the first direction D1. The ratio of the third distance d3 to the fourth distance d4 is in the range of 1 to 1.5, such as 1.1, 1.2, 1.3, 1.4, and the like. Such a configuration trades off between the area of the sub-pixels and the limit distance that the process can achieve, enabling flexible design of the pixel pattern.

It will be understood that the distance between each third sub-pixel 103 and its directly adjacent first sub-pixel 101 and the distance between that third sub-pixel 103 and its directly adjacent second sub-pixel 102 has to be greater than or equal to a process limit distance to meet the process requirements. Here, a distance between two sub-pixels is defined as the shortest one of the distances between points of one of the two sub-pixels and points of the other of the two sub-pixels. The process limit distance depends on the manufacturing process used. In embodiments where a fine metal mask (FMM) is used in combination with etching, the minimum distance is about 16 μm. In embodiments where lasering or electroforming is employed, the minimum distance would be even smaller.

FIG. 2 further shows a large rectangle (hereinafter referred to as "first imaginary rectangle") defined by the dashed line connecting the first sub-pixels 101 at the four corners. The first imaginary rectangle includes four small rectangles (hereinafter referred to as "second imaginary rectangles"), each of which is defined by a respective vertex of four vertices of the first imaginary rectangle, respective centers of two adjoining ones, which contain that respective vertex, of four sides of the first imaginary rectangle, and a center of the first imaginary rectangle. The pixel arrangement of FIG. 2 is described below with reference to the first imaginary rectangle and the second imaginary rectangle.

The pixel arrangement includes five first sub-pixels 101 respectively located at the center and the four vertices of the first imaginary rectangle, four second sub-pixels 102 located at respective centers of the four sides of the first imaginary rectangle, and four third sub-pixels 103 located within respective ones of the four second imaginary rectangles. It will be understood that the phrase "a sub-pixel located at a position" means that the sub-pixel overlaps the position without necessarily requiring the center of the sub-pixel to overlap that position. The center of the sub-pixel may be the geometric center of the sub-pixel or the center of a light-emitting zone of the sub-pixel.

In some embodiments, the third sub-pixels 103 may have substantially the same area. In an alternative embodiment, first ones of the third sub-pixels 103 may each have an area and second ones of the third sub-pixels 103 may each have another area different from that area. In the example of FIG. 2, the third sub-pixel 103B may have a larger area than the area of the third sub-pixel 103A.

Figure 3:
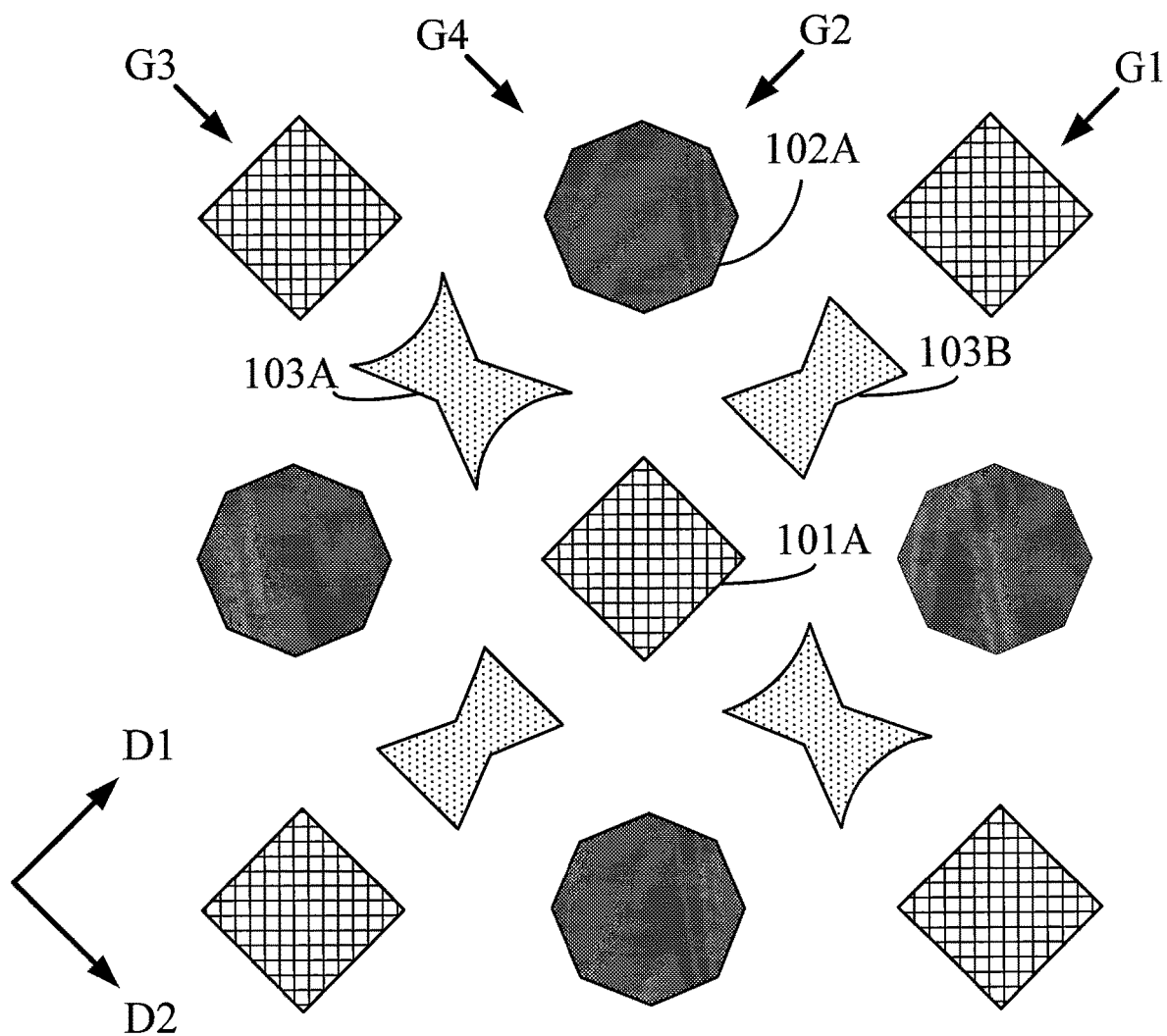
FIG. 3 is a schematic plan view of a partial area of a variation of the pixel arrangement of FIG. 1.

FIG. 3 is a schematic plan view of a partial area of a variation of the pixel arrangement 100 of FIG. 1.

An exemplary variation in shape of the second sub-pixels 102 and the third sub-pixels 103 is shown in FIG. 3. In this example, the second sub-pixels 102 have substantially the same shape of a convex polygon, and the third sub-pixels 103 in the first groups G1 have substantially the same shape of a first concave polygon, and the third sub-pixels 103 in the second groups G2 have substantially the same shape of a second concave polygon.

In this embodiment, each of the third sub-pixels 103 in the plurality of first groups of sub-pixels G1 has a side substantially parallel and opposite to a side of a directly adjacent one of the first sub-pixels 101 in the first direction D1. In the example of FIG. 3, the third sub-pixel 103B has a side substantially parallel and opposite to a side of the directly adjacent first sub-pixel 101A in the first direction D1.

In this embodiment, each of the third sub-pixels 103 in the plurality of second groups of sub-pixels G2 has a side substantially parallel and opposite to a side of a directly adjacent one of the second sub-pixels 102 in the first direction D1. In the example of FIG. 3, the third sub-pixel 103A has a side substantially parallel and opposite to a side of the directly adjacent second sub-pixel 102A in the first direction D1.

In this embodiment, each of the third sub-pixels 103 in the plurality of fourth groups of sub-pixels G4 has a side substantially parallel and opposite to a side of a directly adjacent one of the second sub-pixels 102 in the second direction D2. In the example of FIG. 3, the third sub-pixel 103B has a side substantially parallel and opposite to a side of the directly adjacent second sub-pixel 102A in the second direction D2.

Such a configuration provides a uniform width of a gap between a third sub-pixel 103 and its directly adjacent first sub-pixel 101 as well as a uniform width of a gap between that third sub-pixel 103 and its directly adjacent second sub-pixel 102, whereby facilitating the desired display effect. In some embodiments, the pitch between the third sub-pixel 103 and its directly adjacent first sub-pixel 101 is equal to the pitch between the third sub-pixel 103 and its directly adjacent second sub-pixel 102. In some embodiments, the pitch between a first sub-pixel 101 and its directly adjacent second sub-pixel 102 is substantially equal to the pitch between any other first sub-pixel 101 and its directly adjacent second sub-pixel 102. However, the present disclosure is not limited thereto, and other alternative embodiments are possible.

Figure 4:
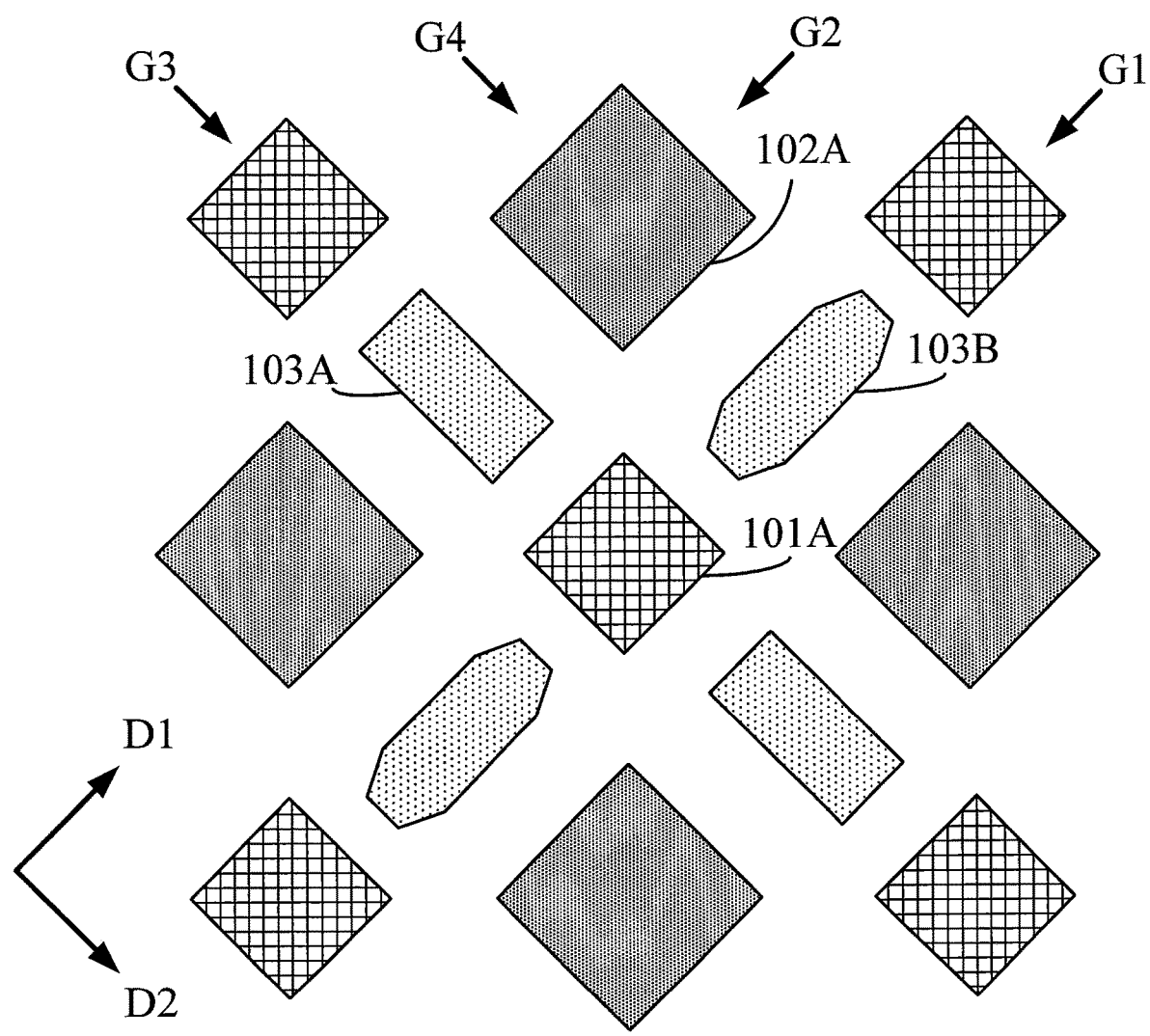
FIG. 4 is a schematic plan view of a partial area of another variation of the pixel arrangement of FIG. 1.

FIG. 4 is a schematic plan view of a partial area of another variation of the pixel arrangement 100 of FIG. 1.

An exemplary variation in shape of the third sub-pixels 103 is shown in FIG. 4. In this example, the third sub-pixels 103B in the first groups G1 have substantially the same convex polygonal shape, and the third sub-pixels 103A in the second groups G2 have substantially the same rectangular shape.

Compared with the embodiment of FIG. 3, each of the third sub-pixels 103 in the plurality of third groups of sub-pixels G3 in this embodiment further has a side substantially parallel and opposite to a side of a directly adjacent one of the first sub-pixels 101 in the second direction D2. As shown in FIG. 4, the third sub-pixel 103A has a side substantially parallel and opposite to a side of the directly adjacent first sub-pixel 101A in the second direction D2. This provides a uniform width of the gap between the third sub-pixel 103 and its directly adjacent first sub-pixel 101 in both the first direction D1 and the second direction D2, and thus facilitates a desired display effect, as described above.

Figure 5:
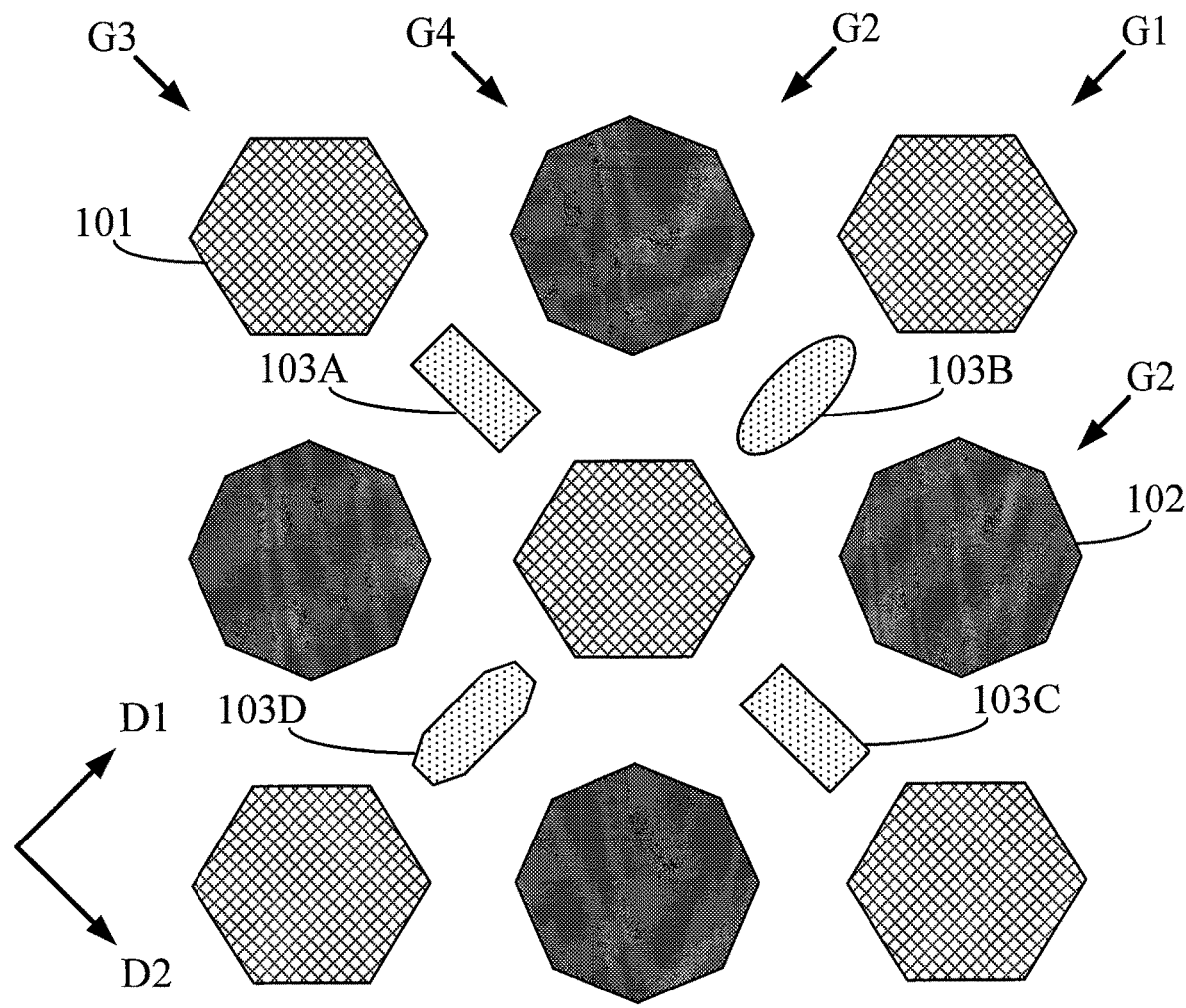
FIG. 5 is a schematic plan view of a partial area of another variation of the pixel arrangement of FIG. 1.

FIG. 5 is a schematic plan view of a partial area of another variation of the pixel arrangement 100 of FIG. 1.

An exemplary variation in shape of the first sub-pixels 101, the second sub-pixels 102, and the third sub-pixels 103 is shown in FIG. 5. In this example, the first sub-pixels 101 each have a regular hexagonal shape, the second sub-pixels 102 each have a regular octagonal shape, the third sub-pixel 103B in the first group G1 has an elliptical shape, the third sub-pixel 103D in the first group G1 has a convex polygonal (specifically, hexagonal) shape, and the third sub-pixels 103A and 103C in the second groups G2 each have a rectangular shape. In each first group G1, the elliptical shape and the convex polygonal shape alternately appear for the third sub-pixels 103. This provides flexible design of the pixel pattern.

Figure 6:
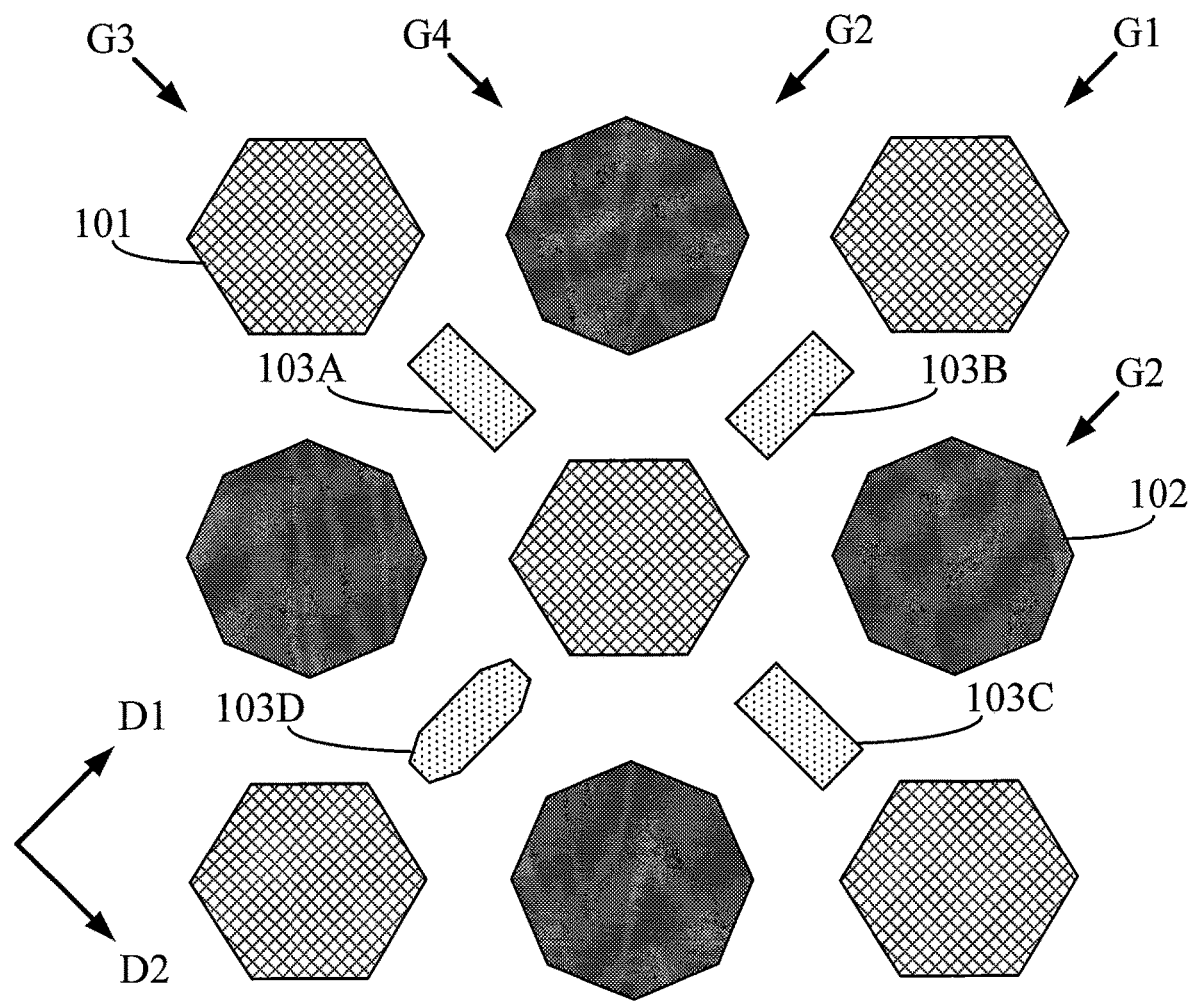
FIG. 6 is a schematic plan view of a partial area of another variation of the pixel arrangement of FIG. 1.

FIG. 6 is a schematic plan view of a partial area of another variation of the pixel arrangement 100 of FIG. 1.

Similar to the embodiment of FIG. 5, the first sub-pixels 101 each have a regular hexagonal shape, the second sub-pixels 102 each have a regular octagonal shape, and the third sub-pixels 103A and 103C in the second groups G2 each have a rectangular shape.

Unlike the embodiment of FIG. 5, the third sub-pixel 103B in the first group G1 has a rectangular shape, and the third sub-pixel 103D in the first group G1 has a convex polygonal (specifically, hexagonal) shape. In each first group G1, the rectangular shape and the convex polygonal shape alternately appear for the third sub-pixels 103. This provides flexible design of the pixel pattern.

Figure 7:
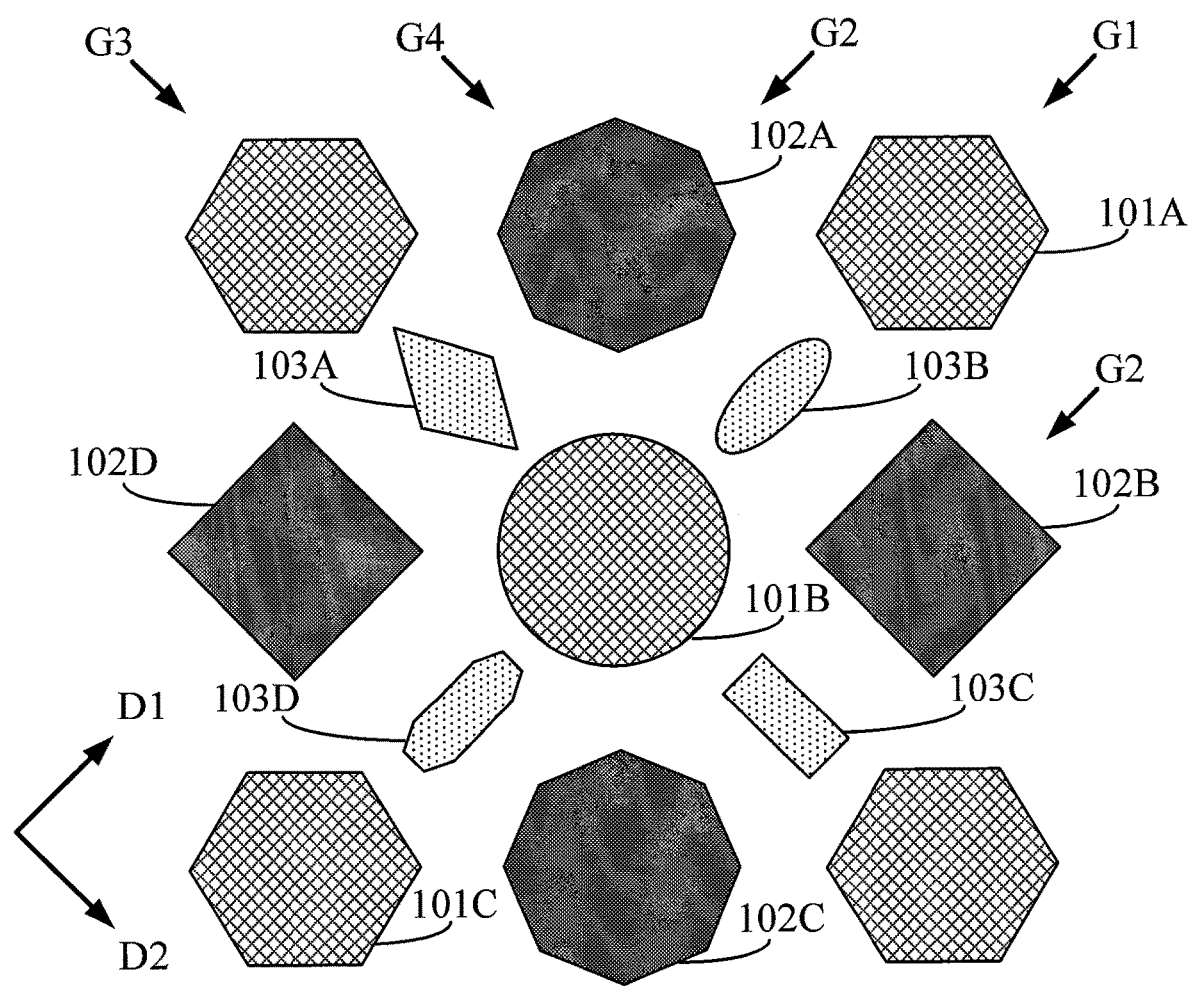
FIG. 7 is a schematic plan view of a partial area of another variation of the pixel arrangement of FIG. 1.

FIG. 7 is a schematic plan view of a partial area of another variation of the pixel arrangement 100 of FIG. 1. An exemplary variation in shape of the first sub-pixels 101, the second sub-pixels 102, and the third sub-pixels 103 is shown in FIG. 7.

The first sub-pixels 101A and 101C in the first group G1 each have a regular hexagonal shape, and the first sub-pixel 101B in the first group G1 has a circular shape. In each first group G1, the regular hexagonal shape and the circular shape appear alternately for the first sub-pixels 101.

The second sub-pixels 102A and 102C in the second groups G2 each have a regular octagonal shape, and the second sub-pixels 102B and 102D in the second groups G2 each have a rectangular (specifically, square) shape. Although not shown, the regular octagonal shape and the square shape appear alternately for the second sub-pixels 102 in each second group G2.

The third sub-pixel 103B in the first group G1 has an elliptical shape, and the third sub-pixel 103D in the first group G1 has a convex polygonal (specifically, hexagonal) shape. In each first group G1, the elliptical shape and the convex polygonal shape alternately appear for the third sub-pixels 103. The third sub-pixel 103A in the second group G2 has a diamond shape, and the third sub-pixel 103C in the second group G2 has a rectangular shape. Although not shown, the rectangular shape and the diamond shape appear alternately for the third sub-pixels 103 in each second group G2. This provides flexible design of the pixel pattern.

Figure 8:
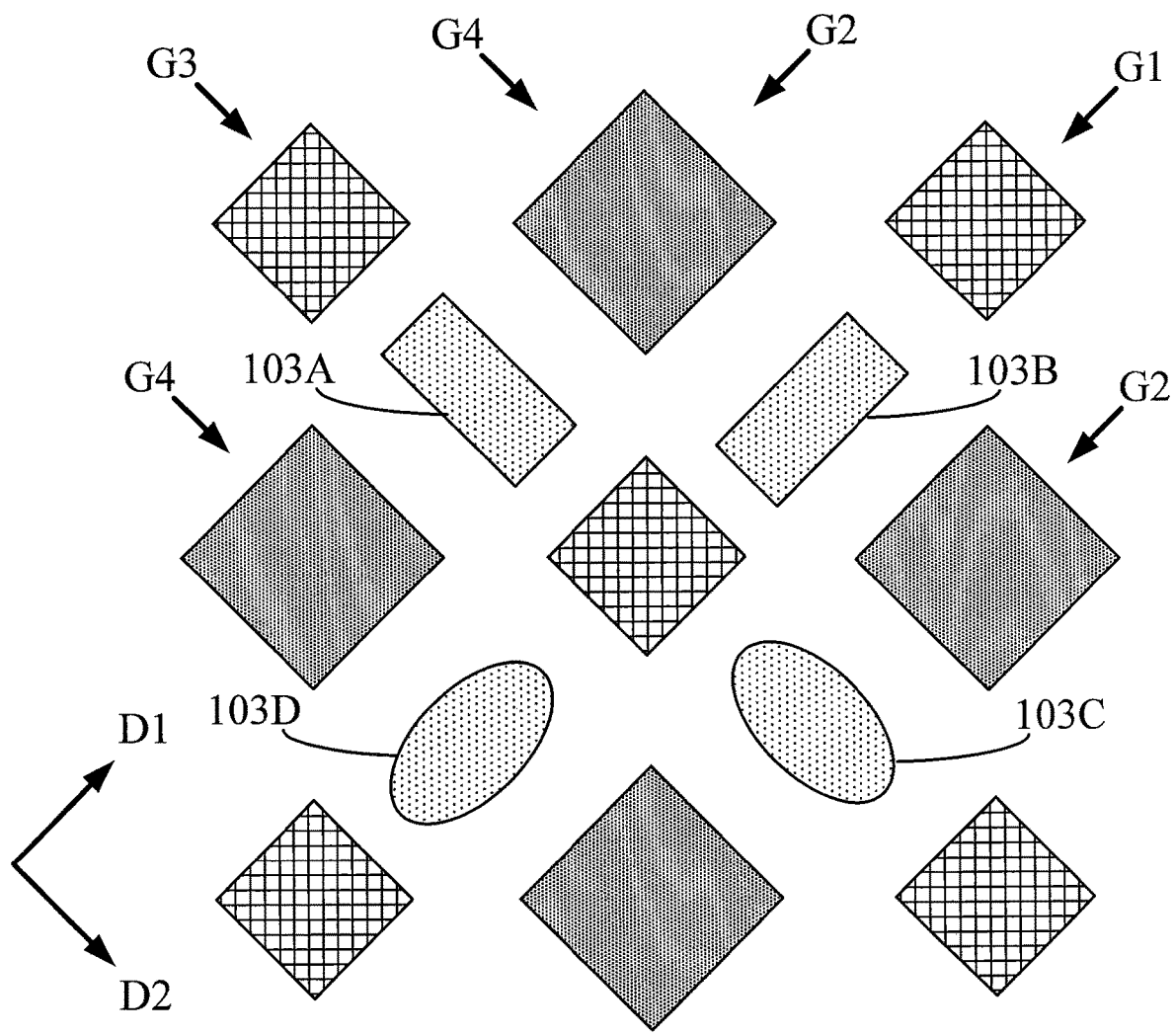
FIG. 8 is a schematic plan view of a partial area of another variation of the pixel arrangement of FIG. 1.

FIG. 8 is a schematic plan view of a partial area of another variation of the pixel arrangement 100 of FIG. 1.

An exemplary variation in shape of the third sub-pixels 103 is shown in FIG. 8. In this example, the third sub-pixel 103B in the first group G1 has a rectangular shape, and the third sub-pixel 103D in the first group G1 has an elliptical shape. In each first group G1, the rectangular shape and the elliptical shape alternately appear for the third sub-pixels 103. Moreover, the third sub-pixel 103A in the second group G2 has a rectangular shape, and the third sub-pixel 103C in the second group G2 has an elliptical shape. Although not shown, the rectangular shape and the elliptical shape alternately appear for the third sub-pixels 103 in each second group G2. This provides flexible design of the pixel pattern.

In this embodiment, the third groups of sub-pixels G3 may have substantially the same pattern as the first groups of sub-pixels G1, and the fourth groups of sub-pixels G4 may have substantially the same pattern as the second groups of sub-pixels G2. Specifically, as shown in FIG. 8, the third groups of sub-pixels G3 will coincide with the first groups of sub-pixels G1 if rotated clockwise by 90 degrees, and the fourth groups of sub-pixels G4 will coincide with the second groups of sub-pixels G2 if rotated clockwise by 90 degrees. This provides an even distribution of the sub-pixels, which is advantageous for the improvement of the display effect.

Although various variations of the first sub-pixels 101, the second sub-pixels 102, and the third sub-pixels 103 are described above in connection with FIGS. 1-8, the present disclosure is not limited thereto. For example, the first sub-pixels 101, the second sub-pixels 102, and the third sub-pixels 103 may have at least one shape selected from the group consisting of a rectangle, an ellipse, a convex polygon, a concave polygon, a triangle, and a circle. Other irregular shapes are also possible. In some embodiments, the first sub-pixels 101 may have substantially the same area. In an alternative embodiment, first ones of the first sub-pixels 101 may each have an area and second ones of the first sub-pixels 101 may each have another area different from that area. In some embodiments, the second sub-pixels 102 may have substantially the same area. In an alternative embodiment, first ones of the second sub-pixels 102 may each have an area and second ones of the second sub-pixels 102 may each have another area different from that area. In practice, the shape, area, orientation, and relative position of the first sub-pixels 101, the second sub-pixels 102, and the third sub-pixels 103 can be designed as needed.

In the embodiments described above, the third sub-pixels 103 may be green sub-pixels. In some embodiments, the first sub-pixels 101 may be red sub-pixels and the second sub-pixels 102 may be blue sub-pixels. Alternatively, the first sub-pixels 101 may be blue sub-pixels, and the second sub-pixels 102 may be red sub-pixels. Since the human eye is more sensitive to green light, the area of the third sub-pixel 103 may be relatively small. In some embodiments, the area of the green sub-pixel is smaller than the area of the red sub-pixel, and the area of the red sub-pixel is smaller than the area of the blue sub-pixel. Alternatively, the area of the red sub-pixel is smaller than the area of the green sub-pixel, and the area of the green sub-pixel is smaller than the area of the blue sub-pixel. The red sub-pixels have a first total area, the green sub-pixels have a second total area, and the blue sub-pixels have a third total area. In some embodiments, the first total area, the second total area, and the third total area have a ratio of 1:(1.1~1.5):(1.2~1.7), further 1:(1.2~1.35):(1.4 to 1.55), or further 1:1.27:1.46. This provides different levels of visual quality improvement compared to pixel patterns in which the red, green, and blue sub-pixels have the same total area. In some embodiments, the ratio of the red sub-pixels, the green sub-pixels, and the blue sub-pixels in quantity is approximately 1:2:1. This can be achieved by sufficiently extending the pattern of the pixel arrangement in both the first direction D1 and the second direction D2. The term "approximately" is intended to cover a certain range of error, such as ±10% (based on the number of the red or blue sub-pixels). For example, 1:1.9:1 is considered to be "approximately 1:2:1".

Figure 9:
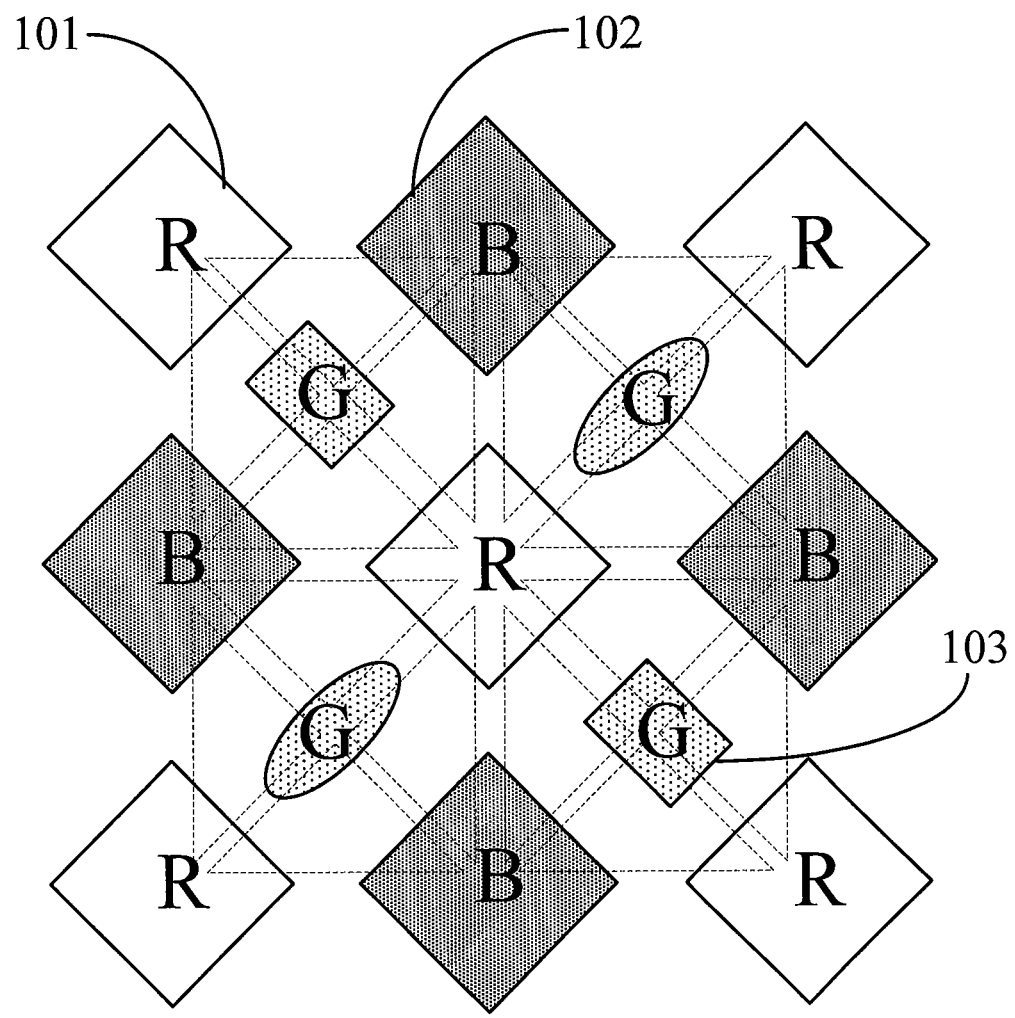
FIG. 9 is a schematic view generally showing a principle of color-borrowing of a pixel arrangement according to an embodiment of the present disclosure.

FIG. 9 generally illustrates the principle of color-borrowing of a pixel arrangement in accordance with an embodiment of the present disclosure.

In this example, the first sub-pixels 101 are red sub-pixels, the second sub-pixels 102 are blue sub-pixels, and the third sub-pixels 103 are green sub-pixels. The area of the second sub-pixel 102 is the same as the area of the first sub-pixel 101, that is, the area of the red sub-pixel is the same as the area of the blue sub-pixel.

As shown in FIG. 9, the green sub-pixel G, the red sub-pixel R, and the blue sub-pixel B located at the vertices of each dashed-line triangle form a respective virtual pixel. Advantageously, there are always common sub-pixels between directly adjacent dashed-line triangles. This provides a higher virtual resolution than the physical resolution, improving the display effect. Furthermore, as described above, the first sub-pixels 101, the second sub-pixels 102, and the third sub-pixels 103 are allowed to be arranged more closely, thereby providing a larger area per sub-pixel than the existing pixel arrangement.

Figure 10:
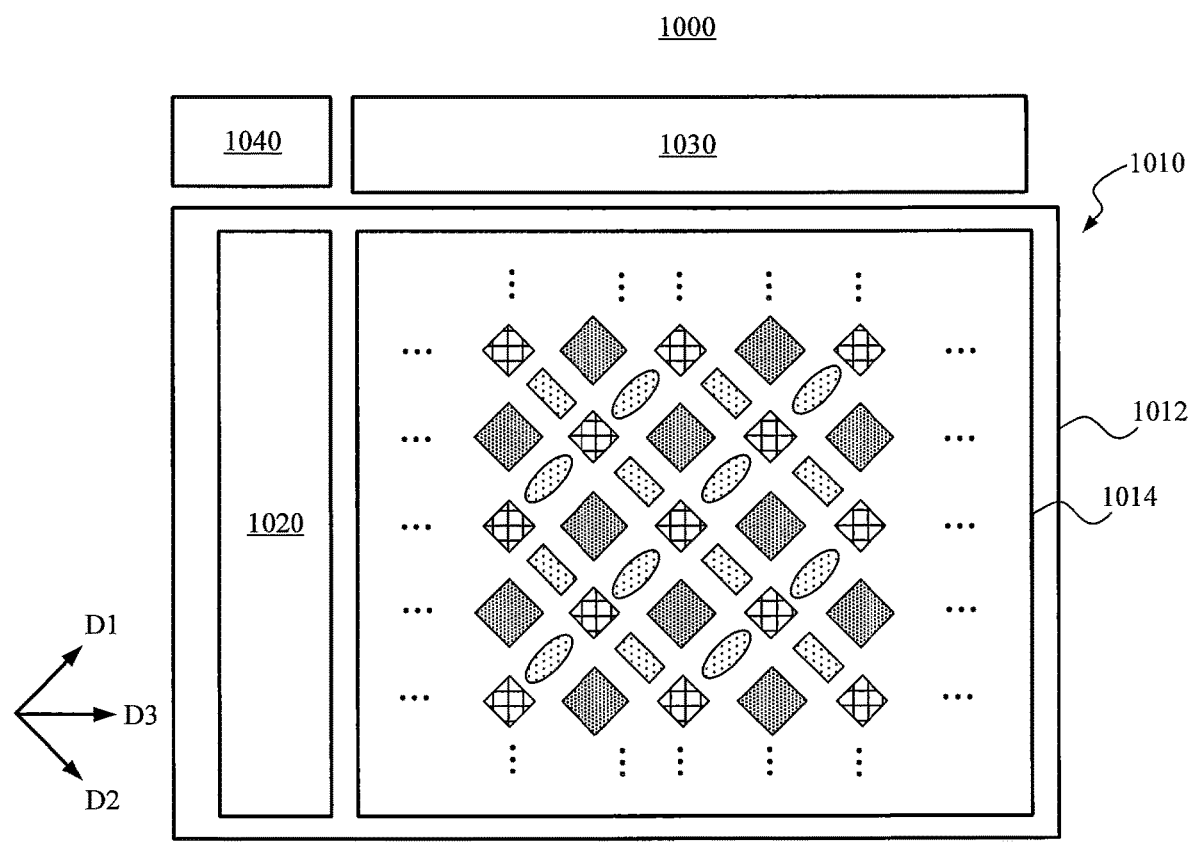
FIG. 10 is a schematic plan view of a display device according to an embodiment of the present disclosure.

FIG. 10 is a schematic plan view of a display device 1000 in accordance with an embodiment of the present disclosure.

Referring to FIG. 10, the display device 1000 includes a display panel 1010, a scan driver 1020, a data driver 1030, and a timing controller 1040.

The display panel 1010 includes a display substrate 1012 and a pixel arrangement 1014 formed on the display substrate 1012. The pixel arrangement 1014 may take the form of any of the pixel arrangement 100 and various variations thereof described above with respect to FIGS. 1-9. The pixel arrangement 1014 is arranged such that each of the first direction D1 and the second direction D2 (according to which the configurations of the pixel arrangement 100 and its various variations have been described) intersects a length direction D3 of the display substrate 1012 at approximately 45 degrees. The term "approximately" is intended to cover a certain range of error, such as ±10%. For example, 40.5 degrees is considered to be "approximately 45 degrees." The sub-pixels in the pixel arrangement 1014 may be organic electroluminescence sub-pixels, although the disclosure is not limited thereto.

From the perspective of the first imaginary rectangle, the pixel arrangement 1014 includes a plurality of adjoining first imaginary rectangles. In the row direction (the horizontal direction in FIG. 10), each two directly adjacent ones of the first imaginary rectangles have a common side such that the sub-pixels on the common side are shared by those two directly adjacent first imaginary rectangles. In the column direction (the vertical direction in FIG. 10), each two directly adjacent ones of the first imaginary rectangles have a common side such that the sub-pixels on the common side are shared by those two directly adjacent first imaginary rectangles.

The scan driver 1020 outputs gate scan signals to the display panel 1010. In some exemplary embodiments, the scan driver 1020 may be directly integrated in the display substrate 1012 as a gate-driver-on-array (GOA) circuit. Alternatively, the scan driver 1020 may be connected to the display panel 1010 by a Tape Carrier Package (TCP). The implementation of the scan driver 1020 may be known, and a detailed description thereof is thus omitted.

The data driver 1030 outputs data voltages to the display panel 1010. In some embodiments, the data driver 1030 may include a plurality of data driving chips that operate in parallel. The implementation of the data driver 1030 may be known, and a detailed description thereof is thus omitted.

The timing controller 1040 controls the operations of the scan driver 1020 and the data driver 1030. Specifically, the timing controller 1040 outputs data control signals and image data to control the driving operation of the data driver 1030, and outputs gate control signals to control the driving operation of the scan driver 1020. The data control signals and the image data are applied to the data driver 1030. The gate control signals are applied to the scan driver 1020. The implementation of the timing controller 1040 may be known, and a detailed description thereof is thus omitted.

The display device 1000 has the same advantages as the pixel arrangement embodiments described above with respect to FIGS. 1-9, which will not be repeated herein. By way of example and not limitation, the display device 1000 can be any product or component having a display function, such as a cell phone, a tablet computer, a television set, a display, a notebook computer, a digital photo frame, a navigator, and the like.

Figure 11A:
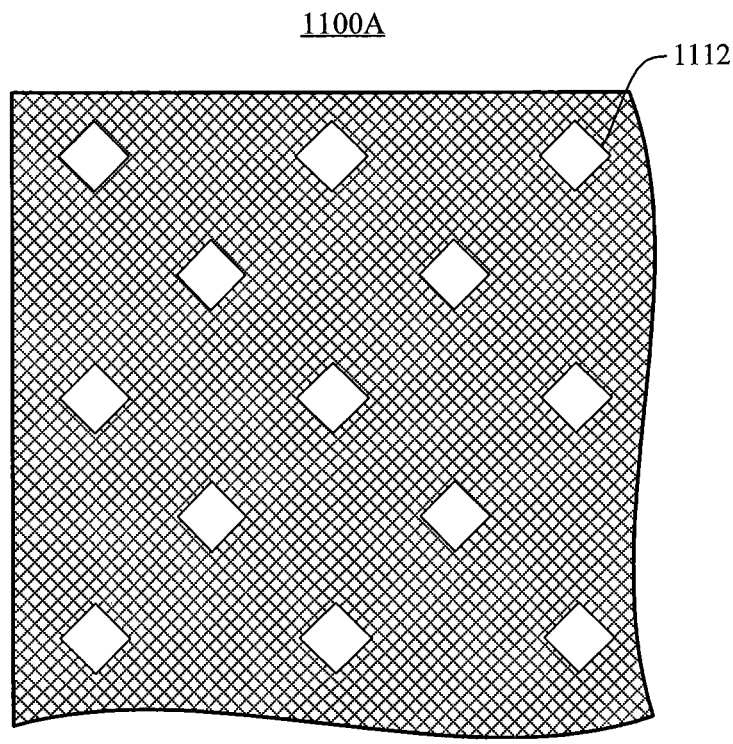
FIGS. 11A, 11B, and 11C are schematic plan views of a set of masks according to an embodiment of the present disclosure.
Figure 11B:
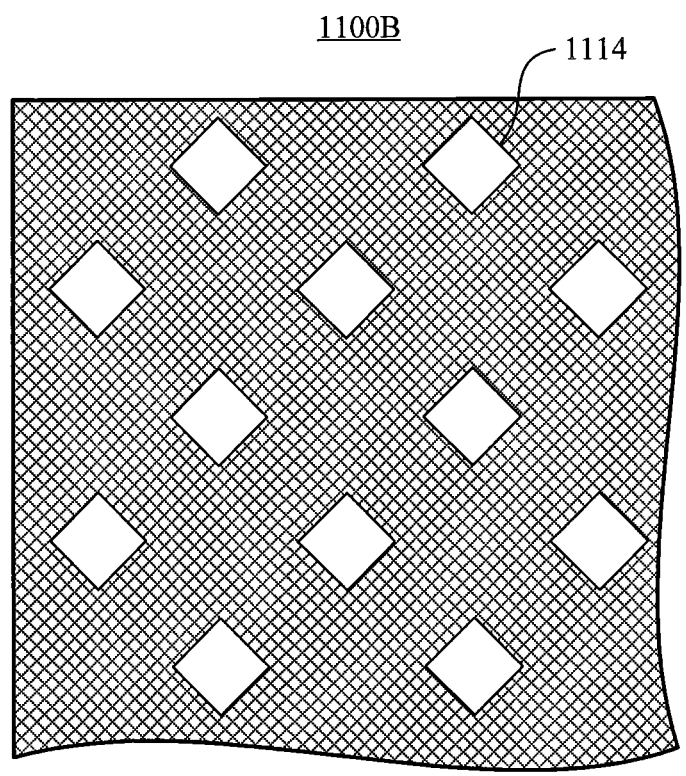
Figure 11C:
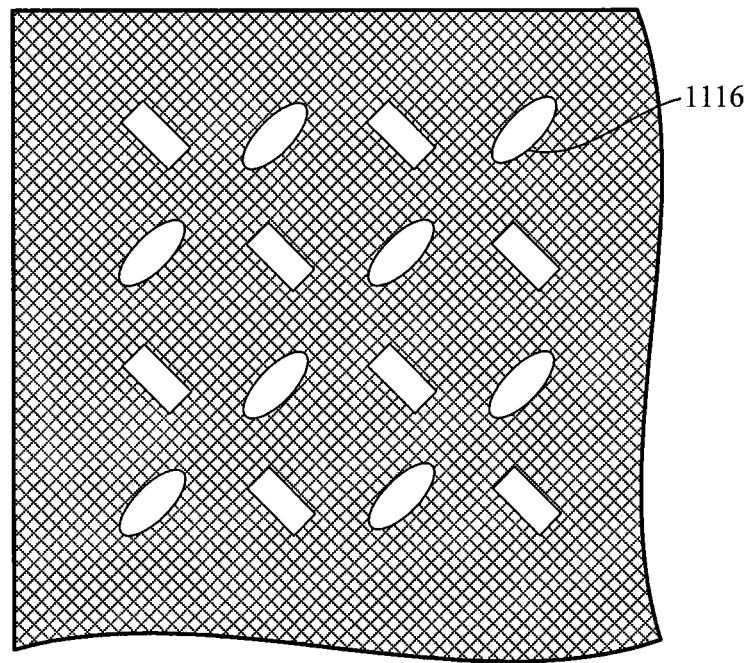

FIGS. 11A, 11B, and 11C are schematic plan views of a set of masks in accordance with an embodiment of the present disclosure. The set of masks includes a first mask 1100A, a second mask 1100B, and a third mask 1100C.

Referring to FIG. 11A, only a part of the first mask 1100A is shown. The first mask 1100A defines a plurality of first openings 1112. The plurality of first openings 1112 are arranged to have a pattern corresponding to the pattern of the first sub-pixels of any of the pixel arrangement 100 and various variations thereof described above with respect to FIGS. 1-9. In this example, the plurality of first openings 1112 are arranged to have a pattern corresponding to the pattern of the first sub-pixels of the pixel arrangement 100 of FIG. 1. In some embodiments, the mask 1100A is a fine metal mask that can be used in an evaporation process to form a desired pixel pattern.

Referring to FIG. 11B, only a part of the second mask 1100B is shown. The second mask 1100B defines a plurality of second openings 1114. The plurality of second openings 1114 are arranged to have a pattern corresponding to the pattern of the second sub-pixels of any of the pixel arrangement 100 and various variations thereof described above with respect to FIGS. 1-9. In this example, the plurality of second openings 1114 are arranged to have a pattern corresponding to the pattern of the second sub-pixels of the pixel arrangement 100 of FIG. 1. In some embodiments, the mask 1100B is a fine metal mask that can be used in an evaporation process to form a desired pixel pattern.

Referring to FIG. 11C, only a part of the third mask 1100C is shown. The third mask 1100C defines a plurality of third openings 1116. The plurality of third openings 1116 are arranged to have a pattern corresponding to the pattern of the third sub-pixels of any of the pixel arrangement 100 and various variations thereof described above with respect to FIGS. 1-9. In this example, the plurality of third openings 1116 are arranged to have a pattern corresponding to the pattern of the third sub-pixels of the pixel arrangement 100 of FIG. 1. In some embodiments, the mask 1100C is a fine metal mask that can be used in an evaporation process to form a desired pixel pattern.

The masks 1100A, 1100B, and 1100C may provide the same advantages as pixel arrangement embodiments described above with respect to FIGS. 1-9, which are not repeated herein.

Figure 12:
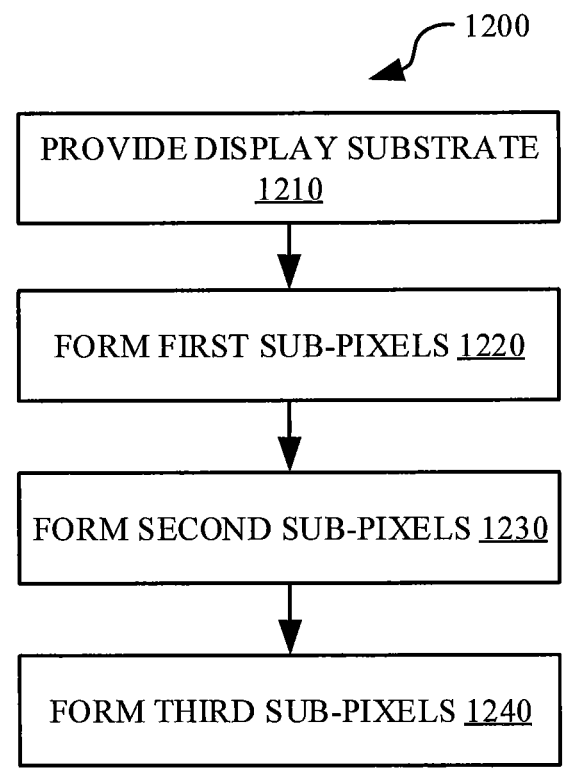
FIG. 12 is a flow chart of a method of manufacturing a pixel arrangement in accordance with an embodiment of the present disclosure.

FIG. 12 is a flow chart of a method 1200 of manufacturing a pixel arrangement in accordance with an embodiment of the present disclosure. The pixel arrangement embodiments described above with respect to FIGS. 1-9 can be implemented using the method 1200 and the masks 1100A, 1100B, and 1100C.

Referring to FIG. 12, at step 1210, a display substrate is provided. The display substrate is typically a back-plate that has been provided with driving circuits formed of, for example, thin film transistor (TFTs). At step 1220, a first electroluminescent material is evaporated and the evaporated first electroluminescence material is deposited onto the display substrate to form the first sub-pixels 101 by passing the evaporated first electroluminescent material through the plurality of first openings 1112 of the first mask 1100A. At step 1230, a second electroluminescent material is evaporated and the evaporated second electroluminescence is deposited onto the display substrate to form the second sub-pixels 102 by passing the evaporated second electroluminescent material through the plurality of second openings 1114 of the second mask 1100B. At step 1240, a third electroluminescent material is evaporated and the evaporated third electroluminescence is deposited onto the display substrate to form the third sub-pixels 103 by passing the evaporated third electroluminescent material through the plurality of third openings 1116 of the third mask 1100C. Steps 1220 to 1240 are generally referred to as evaporation, whereby the pixel pattern can be formed at predetermined positions on the display substrate. It will be understood that steps 1220 to 1240 can be performed in an order different from that illustrated and described. In some embodiments, the electroluminescent materials may be organic electroluminescent materials. Other electroluminescent materials are possible.

Variations to the disclosed embodiments can be understood and effected by the skilled person in practicing the claimed subject matter, from a study of the drawings, the disclosure, and the appended claims. While operations are depicted in the drawings in a particular order, this should not be understood as requiring that such operations are to be performed in the particular order shown or in a sequential order, or that all illustrated operations are to be performed to achieve desirable results. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A pixel arrangement, comprising:
a plurality of first groups of sub-pixels arranged in a first direction, each of the plurality of first groups comprising a first plurality of first sub-pixels and a first plurality of third sub-pixels arranged alternately; and
a plurality of second groups of sub-pixels arranged in the first direction, each of the plurality of second groups comprising a second plurality of third sub-pixels and a first plurality of second sub-pixels arranged alternately,
wherein the plurality of first groups and the plurality of second groups are alternately arranged in a second direction perpendicular to the first direction, and
wherein the plurality of first groups and the plurality of second groups are arranged to form a plurality of third groups of sub-pixels arranged in the second direction and a plurality of fourth groups of sub-pixels arranged in the second direction,
wherein the plurality of third groups and the plurality of fourth groups are alternately arranged in the first direction, and
wherein each of the plurality of third groups comprises a second plurality of first sub-pixels and a third plurality of third sub-pixels arranged alternately, and each of the plurality of fourth groups comprises a fourth plurality of third sub-pixels and a second plurality of second sub-pixels arranged alternately, wherein ones of the first plurality of third sub-pixels in each of the first groups different from ones of the second plurality of third sub-pixels in each of the second groups.

2. The pixel arrangement of claim 1,
wherein ones of the first plurality of third sub-pixels in each of the first groups have a first shape, and
wherein ones of the second plurality of third sub-pixels in each of the second groups have a second shape different from the first shape.

3. The pixel arrangement of claim 1, wherein first ones of the third sub-pixels have a first area and second ones of the third sub-pixels have a second area different from the first area.

4. The pixel arrangement of claim 1,
wherein the third sub-pixels are arranged such that each of the second plurality of third sub-pixels has a first distance from a corresponding one, directly adjacent thereto, of the second plurality of first sub-pixels in one of the first direction or the second direction, and each of the first plurality of third sub-pixels has a second distance from a corresponding one, directly adjacent thereto, of the first plurality of first sub-pixels in a different one of the first direction or the second direction, and
wherein the third sub-pixels are arranged such that each of the first plurality of third sub-pixels have a third distance from corresponding ones, directly adjacent thereto, of the second plurality of second sub-pixels in the one of the first direction or the second direction, and each of the second plurality of third sub-pixels have a fourth distance from corresponding ones, directly adjacent thereto, of the first plurality of second sub-pixels in the different one of the first direction or the second direction.

5. The pixel arrangement of claim 1,
wherein each of the first plurality of third sub-pixels has a side substantially parallel and opposite to a side of a directly adjacent one of the first plurality of first sub-pixels in the first direction,
wherein each of the second plurality of third sub-pixels has a side substantially parallel and opposite to a side of a directly adjacent one of the first plurality of second sub-pixels in the first direction,
wherein each of the third plurality of third sub-pixels has a side substantially parallel and opposite to a side of a directly adjacent one of the second plurality of first sub-pixels in the second direction, and
wherein each of the fourth plurality of third sub-pixels has a side substantially parallel and opposite to a side of a directly adjacent one of the second plurality of second sub-pixels in the second direction.

6. The pixel arrangement of claim 1,
wherein first ones of the first plurality of third sub-pixels each has the first shape, and second ones of the first plurality of third sub-pixels each has the second shape, wherein the first shape and the second shape alternate for adjacent ones of the first plurality of third sub-pixels in the first groups, and
wherein first ones of the second plurality of third sub-pixels each has the second shape, and second ones of the second plurality of third sub-pixels each has the first shape, wherein the first shape and the second shape alternate for adjacent ones of the second plurality of third sub-pixels in the second groups.

7. The pixel arrangement of claim 6,
wherein the third groups of sub-pixels have substantially a same first pattern as the first groups of sub-pixels, and
wherein the fourth groups of sub-pixels have substantially a same second pattern as the second groups of sub-pixels.

8. The pixel arrangement of claim 1, wherein first ones of the first sub-pixels have a first shape and second ones of the first sub-pixels have a second shape different from the first shape.

9. The pixel arrangement of claim 1, wherein first ones of the second sub-pixels have a first area and second ones of the second sub-pixels have a second area different from the first area.

10. The pixel arrangement of claim 1, wherein first ones of the second sub-pixels have a first shape and second ones of the second sub-pixels have a second shape different from the first shape.

11. The pixel arrangement of claim 1,
wherein the first sub-pixels comprise red sub-pixels,
wherein the second sub-pixels comprise blue sub-pixels, and
wherein the third sub-pixels comprise green sub-pixels.

12. The pixel arrangement of claim 1,
wherein the first sub-pixels comprise blue sub-pixels,
wherein the second sub-pixels comprise red sub-pixels, and
wherein the third sub-pixels comprise green sub-pixels.

13. The pixel arrangement of claim 1, wherein the first shape and the second shape are selected from a group comprising a rectangle, an ellipse, a convex polygon, a concave polygon, a triangle, or a circle.

14. The pixel arrangement of claim 1,
wherein the third sub-pixels have substantially the same area.

15. The pixel arrangement of claim 1,
wherein first ones of the third sub-pixels have a width in the first direction larger than a width in the second direction, and second ones of the third sub-pixels have a width in the second direction larger than a width in the first direction.

16. A display panel, comprising:
a display substrate; and
the pixel arrangement of claim 1, wherein the pixel arrangement is on the display substrate,
wherein the pixel arrangement is arranged such that the first direction and the second direction intersect a length direction of the display substrate at approximately 45 degrees.

17. The display panel of claim 16, wherein the first sub-pixels, the second sub-pixels, and the third sub-pixels comprise organic electroluminescent sub-pixels.

18. A display device comprising the display panel of claim 16.

19. A set of masks for manufacturing a pixel arrangement, wherein the pixel arrangement comprises:
a plurality of first groups of sub-pixels arranged in a first direction, each of the plurality of first groups comprising a first plurality of first sub-pixels and a first plurality of third sub-pixels arranged alternately; and
a plurality of second groups of sub-pixels arranged in the first direction, each of the plurality of second groups comprising a second plurality of third sub-pixels and a first plurality of second sub-pixels arranged alternately,
wherein the plurality of first groups and the plurality of second groups are alternately arranged in a second direction perpendicular to the first direction, and wherein the plurality of first groups and the plurality of second groups are arranged to form a plurality of third groups of sub-pixels arranged in the second direction and a plurality of fourth groups of sub-pixels arranged in the second direction, wherein the plurality of third groups and the plurality of fourth groups are alternately arranged in the first direction, and wherein each of the plurality of third groups comprises a second plurality of first sub-pixels and a third plurality of third sub-pixels arranged alternately, and each of the plurality of fourth groups comprises a fourth plurality of third sub-pixels and a second plurality of second sub-pixels arranged alternately, wherein ones of the first plurality of third sub-pixels in each of the first groups different from ones of the second plurality of third sub-pixels in each of the second groups, wherein the set of masks comprise:

a first mask defining a plurality of first openings arranged to have a first pattern corresponding to a first pattern of the first sub-pixels;

a second mask defining a plurality of second openings arranged to have a second pattern corresponding to a second pattern of the second sub-pixels; and a third mask defining a plurality of third openings arranged to have a third pattern corresponding to a third pattern of the third sub-pixels.

20. A method of manufacturing a pixel arrangement using the set of masks of claim 19, comprising:

providing a display substrate;

evaporating a first electroluminescent material and depositing the first electroluminescent material that was evaporated onto the display substrate to form the first sub-pixels by passing the first electroluminescent material that was evaporated through the plurality of first openings of the first mask;

evaporating a second electroluminescent material and depositing the second electroluminescent material that was evaporated onto the display substrate to form the second sub-pixels by passing the second electroluminescent material that was evaporated through the plurality of second openings of the second mask; and evaporating a third electroluminescent material and depositing the third electroluminescent material that was evaporated onto the display substrate to form the third sub-pixels by passing the third electroluminescent material that was evaporated through the plurality of third openings of the third mask.

* * * * *